(12) United States Patent
Pasch et al.

(10) Patent No.: US 6,458,508 B1
(45) Date of Patent: Oct. 1, 2002

(54) METHOD OF PROTECTING ACID-CATALYZED PHOTORESIST FROM CHIP-GENERATED BASIC CONTAMINANTS

(75) Inventors: Nicholas F. Pasch, Pacifica; Shumay X. Dou; Colin Yates, both of San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/792,321

(22) Filed: Feb. 23, 2001

(51) Int. Cl.[7] ................. G03F 7/11; G03F 7/30
(52) U.S. Cl. .............. 430/276.1; 430/311; 430/313; 438/724
(58) Field of Search ................ 430/278.1, 311, 430/276.1, 312, 313, 314, 315, 316, 317, 318, 319; 438/724

(56) References Cited

U.S. PATENT DOCUMENTS

| | | | | |
|---|---|---|---|---|
| 5,219,788 A | * | 6/1993 | Abernathey et al. | 430/318 |
| 5,372,914 A | * | 12/1994 | Naito et al. | 430/271.1 |
| 5,518,579 A | * | 5/1996 | Katsuyama et al. | 430/313 |
| 5,846,692 A | * | 12/1998 | Katsuyama et al. | 430/311 |
| 5,879,863 A | * | 3/1999 | Azuma et al. | 430/327 |
| 6,103,456 A | * | 8/2000 | Tobben et al. | 430/317 |

OTHER PUBLICATIONS

He et al, SPIE, vol. 3049 p. 988–996, from Proceedings of SPIE; Advances in Resist Technology and Processin XIV, Tarascon–Auriol, ed, presented Mary Mar. 10–12, 1997, pp. 988–996, "Investigating Positive DUV Resist Profile on TiN".*

* cited by examiner

Primary Examiner—Cynthia Hamilton
(74) Attorney, Agent, or Firm—John R. Ley, L.L.C.

(57) ABSTRACT

Increased resolution is available from acid-catalyzed photoresist used in fabricating integrated circuits by inhibiting chemically-basic contaminants from contacting the photoresist placed above an IC structure which emits those chemically-basic contaminants. The inhibition can result from physical barrier characteristics of a barrier layer placed between the contaminant-emitting surface and the overlying layer of photoresist, or the layer of barrier material may contain acid moieties which chemically neutralize the emitted chemically-basic contaminants before the contaminants reach the photoresist.

23 Claims, 3 Drawing Sheets

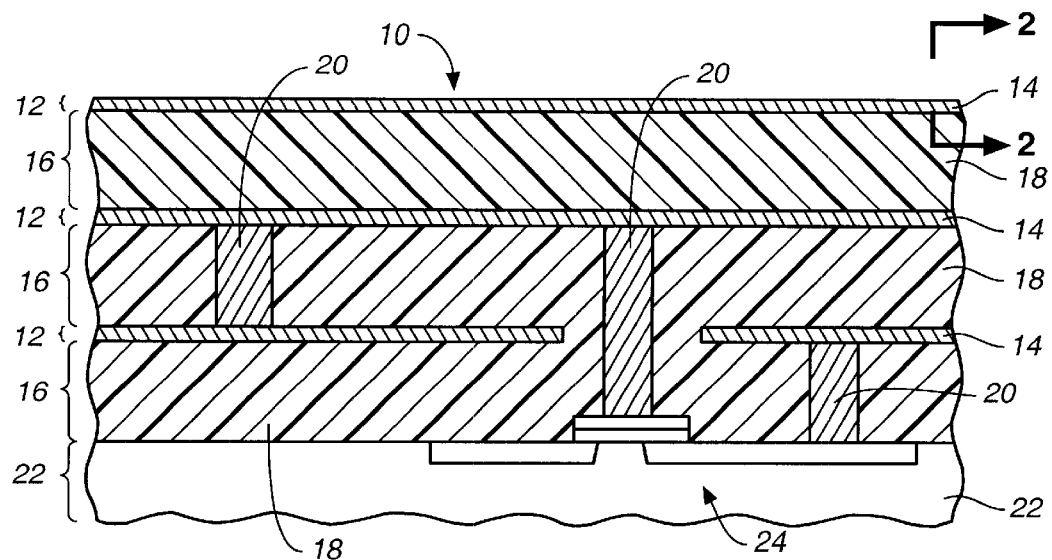
FIG._1
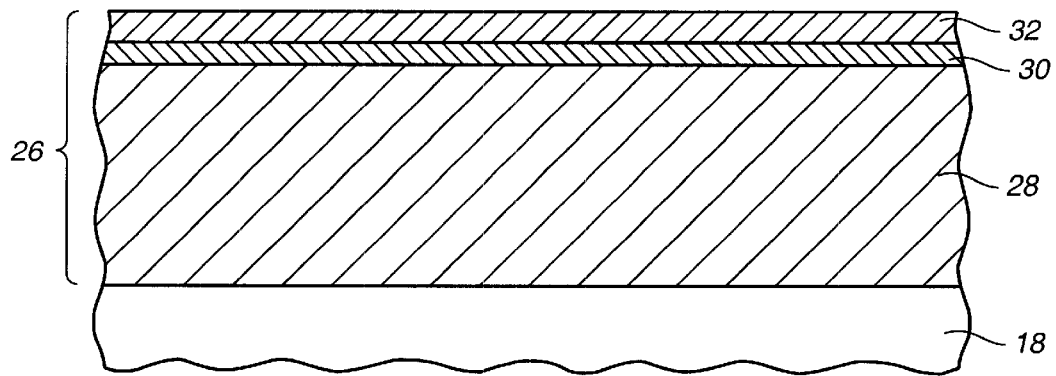
FIG._2 (PRIOR ART)

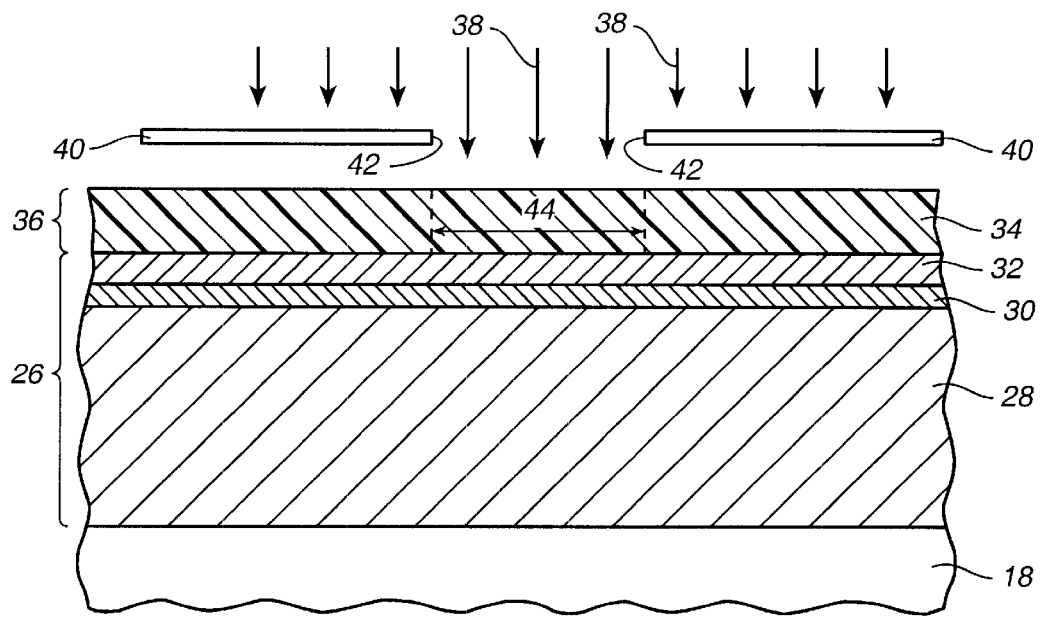
FIG._3 *(PRIOR ART)*
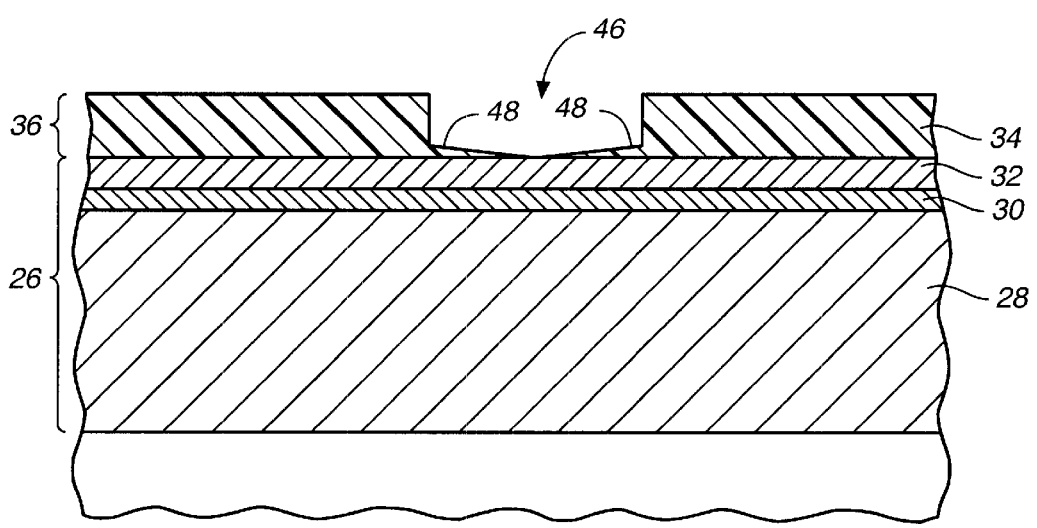
FIG._4

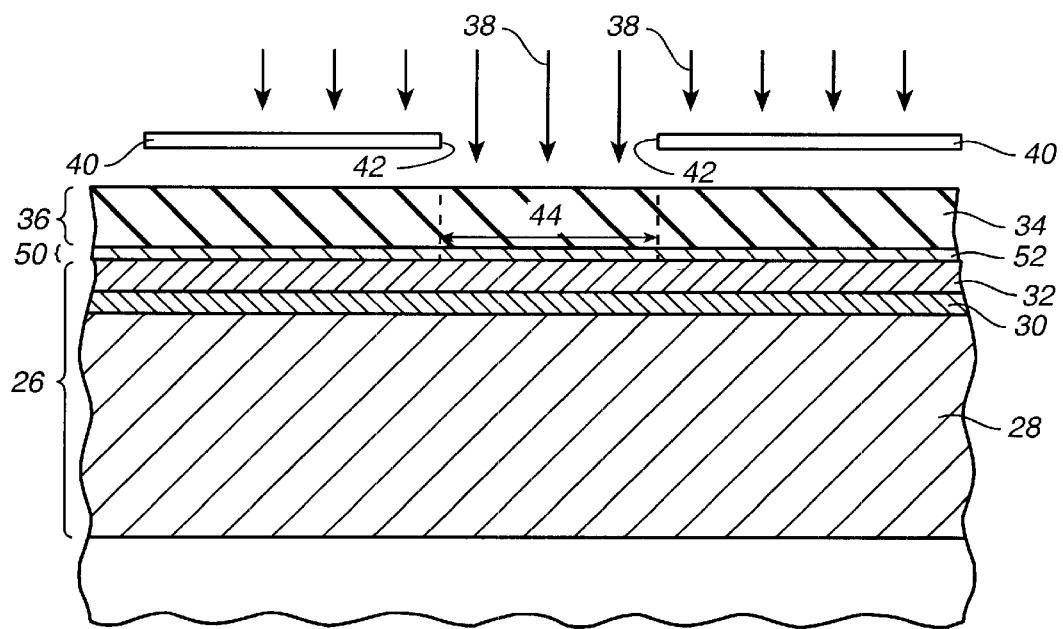
FIG._5
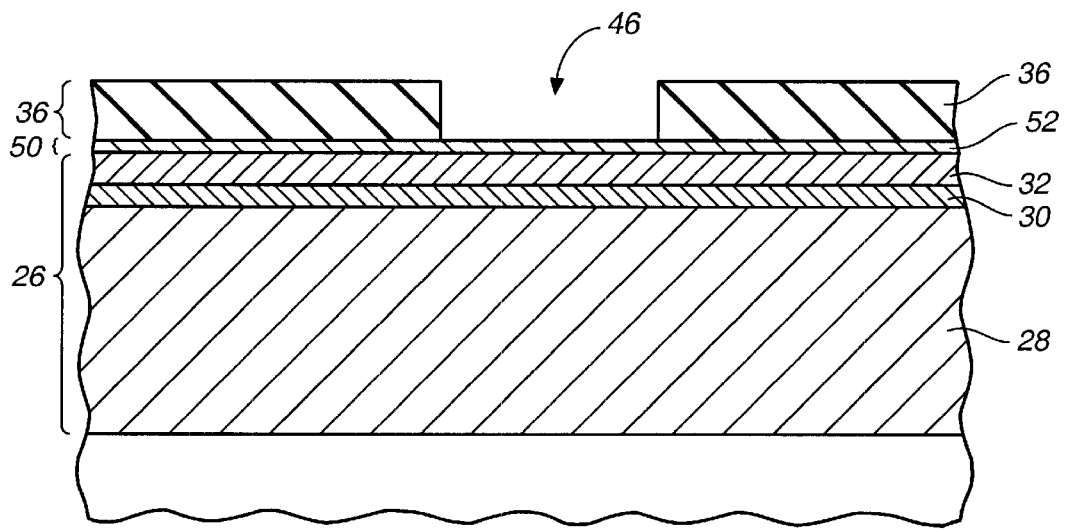
FIG._6

METHOD OF PROTECTING ACID-CATALYZED PHOTORESIST FROM CHIP-GENERATED BASIC CONTAMINANTS

This invention relates to the integrated circuit (IC) fabricating processes using photolithographically patterned photoresist materials of the type whose solubility or insolubility is acid-catalyzed during development of the photoresist. More particularly, the present invention relates to a new and improved method of protecting the acid-catalyzed photoresist material from the adverse influence of chemically-basic contaminants, such as ammonia, which are inherently generated by components of the IC as it undergoes fabrication. The present invention permits more precise and resolved etching of the components of the IC during fabrication, which leads to fewer failed ICs due to fabrication defects.

BACKGROUND OF THE INVENTION

The evolution of integrated circuits (ICs) has involved the continued miniaturization of its components. In addition to reducing the size of the individual components, the spacing or resolution between the various components of the chip has also diminished. The current resolution standard is a sub-micron spacing, in the neighborhood of 0.2 microns. It is expected that future generations of ICs will have even smaller resolutions.

The basic method for forming most of the components of an IC a photolithographic patterning process. A typical photolithographic patterning process involves placing photoresist material on the IC structure and exposing the photoresist to light using a negative or positive mask of the pattern of components. The exposed photoresist material is thereafter developed. The light-exposed photoresist material becomes soluble, which allows it to be washed away. The unexposed photoresist material is undissolved. The soluble areas are removed to provide an opening in the remaining durable mask areas. The open areas define a pattern for the components to be formed, typically by depositing, etching and implanting materials within the exposed areas while the remaining, intact areas shield the other areas. Some types of photoresist materials work in reverse, where the light-exposed areas become the durable mask-like areas and unexposed areas remain soluble and ultimately form the open areas.

In order to obtain the very small resolutions to form the components, the photolithographic patterning process must be capable of patterning and developing the photoresist material with better resolution than the spacing between the finished components of the IC. Photoresist materials which are capable of achieving such high resolutions are very sensitive to the wavelength of the exposure light. A higher degree of resolution in exposure of the photoresist materials requires a shorter wavelength of exposure light. In essence, there is a inverse relationship between the wavelength of the exposure light and the resolution of the developed photoresist materials.

The current generation of photo resist materials respond to wavelengths in the range of approximately 248 nm. It is expected that future generations of photoresist will be capable of securing even higher resolutions and will require exposure light at wavelengths of less than 200 nm. Light sources capable of generating these shorter wavelengths are laser or soft x-ray light sources. The amount of light energy from these sources is significantly low. For example, 248 nm wavelength sources generate in the neighborhood of 5–10 millijoules of energy. By way of comparison, previous types of photoresist material responded to wavelengths in the range of 436 nm, and arc lamp sources which generated those wavelengths were capable of delivering on the order of 100–250 millijoules of energy. The polymeric molecular characteristics of current photoresist materials have been adjusted to obtain good contrast despite the lower energy available from the lower wavelength light sources. Thus, even though exposed to lesser-energy light sources, modern photoresist materials must still obtain significant contrast between the exposed and the unexposed areas. Contrast is responsible for defining the edge characteristics of the features of the components formed on the chip and the resolution between those components.

To respond to shorter wavelengths of lesser power, modern photoresist materials are formed from polymeric chain molecules which contain acid moieties that catalyze to amplify the response initially established by exposure. The initial exposure to light releases some of the acid moieties from the polymeric chains. However, when the exposed photoresist material is thereafter heated, the initially released acid moieties then attack and destroy adjacent polymeric chains and catalyze the release of hundreds or thousands of other acid moieties from adjoining polymeric molecules of the photoresist material. These released acid moieties attack and effectively destroy the polymer chains of the photoresist material in a thorough and complete manner. The broken polymeric chains make the photoresist material soluble so that the open areas can be exposed. The catalyzing effect of the acid moieties accounts for the increased sensitivity and resolution available from modern photoresist material. To preserve the increased sensitivity, it is necessary to assure an effective catalytic response from the acid moieties after the initial light exposure.

It has been recognized that environmental air pollutants can adversely affect the catalytic response of the photoresist. For example, airborne ammonia and ozone are two such contaminants. Ammonia is chemically basic and therefore has the tendency to react with and neutralize the acid moieties of the photoresist material. Neutralized acid moieties can no longer catalyze to destroy the polymer chains within the photoresist material. Neutralizing the acid moieties of the photoresist material results in a diminished resolution capability of the photoresist material, because the photoresist material is not rendered soluble so that it can be eliminated from the open areas.

A variety of techniques that have been proposed to shield the photoresist material from airborne chemically-basic contaminants. One technique is to carbon filter the air that is present over the IC structures during fabrication processing. This technique is somewhat effective against airborne chemically-basic contaminants. Another technique is to add an acid containing polymer material in a layer on top of the photoresist to shield it from the airborne basic contaminants. The acid containing polymer layer neutralizes the chemically-basic contaminants which may diffuse into the photoresist material.

SUMMARY OF THE INVENTION

The present invention is founded on the discovery that certain structures involved in the fabrication of modern ICs emit chemically-basic contaminants, such as ammonia, during the course of fabrication. For example, one source of ammonia contaminants is the electrical conductors formed in multiple layers of metal interconnects. Metal interconnect layers are layers of individual electrical connectors which are formed above a substrate of the IC, which route electrical signals to the components of the IC. The metal interconnect layers are vertically separated from one another by a layer of dielectric insulation, and the individual electrical conductors of each interconnect layer are horizontally spaced from one another, also by dielectric insulation. Indeed, the ability to incorporate significant numbers of multiple metal interconnects layers, with each layer having close resolution of the individual conductors, has itself contributed to the evolution and miniaturization of modern ICs.

The metal structure from which the individual conductors of each metal interconnect layers are formed includes an anti-reflective barrier layer. The anti-reflective characteristics of the layer inhibit reflection of the photoresist exposure light from the metal surfaces onto areas of the photoresist material which are not desired to be exposed. The barrier characteristics create an electrically-conductive but chemically-resistant separation of one interconnect level from the next interconnect layer, so that the chemistry of one layer does not interact with the chemistry of another layer and create unacceptable changes in chemical or electrical properties of the interconnect layers. A typical metal layer uses titanium nitride, tungsten nitride or some other metal nitride as an anti-reflectant and as a barrier. Titanium nitride is generated by sputtering titanium into an atomic fog in the presence of ammonia gas. The titanium reacts with the ammonia, stripping the hydrogen ions off the nitrogen and depositing a thin film of titanium nitride. The deposited titanium nitride film is somewhat porous and entraps and contains within it significant amounts of the ammonia from the environment which generated the titanium nitride.

It has been discovered that when the IC structure is heated to catalyze the acid moieties in photoresist material which has been deposited on the titanium nitride, the entrained ammonia is released. The released ammonia enters the layer of photoresist material applied on top of the metal interconnect structure and neutralizes the acid moieties in the photoresist. Neutralizing the acid moieties destroys the ability of the acid moieties to catalyze and decompose the polymers of the photoresist, thereby decreasing the sensitivity of the photoresist and marring the precision of resolution which would otherwise be available from unaffected photoresist material.

The photoresist loses its sensitivity at the location where the ammonia gas has entered the photoresist material and neutralize the acid moieties, which is typically at the interface of the photoresist material to the underlying metal of the interconnect structure layer. Instead of creating a precise photoresist feature, an abnormally shaped or ragged edge structure called a "foot" is created. The photoresist at the foot cannot be catalyzed by the acid moieties since those acid moieties at the foot have been chemically neutralized by the diffusing ammonia. The foot becomes an area of insoluble photoresist which inhibits etching of the underlying metal. Since most etching steps are timed to an end point where the desired degree of etching is calculated to have occurred, the reduced etching at the location of the foot creates uneven and ragged structures in the metal structure. For example, when etching a space between adjacent conductors in an interconnect layer, the etch begins in the middle of the space and not at the edge of the metal forming the conductor. Sometime later, the foot is ultimately dissolved by the etchant, but the result of the delayed etching caused by the foot is a nonuniform etch from one side of the space to the other. By the time that the etch step should have been completed, the foot will have caused a "ghost" metal image to remain at the edges of the space, and this residual ghost metal may short to the adjacent conductor metal line. As little as 10 angstroms of metal between two adjacent metal lines will short them together to such an extent that the IC will not be functional. Moreover, because of the location of the residual metal, it is impossible or very difficult to inspect for this type of defect and discover the source of the problem.

There is no simple way of keeping the ammonia from out-gassing from the titanium nitride layer and still maintain the desired characteristics of the titanium nitride layer. It is possible to heat the titanium nitride layer in an oxygen ambient and convert the surface to titanium oxide which would completely seal the surface and confine the ammonia within the titanium nitride layer. However in later process steps which require access to the titanium nitride, the surface layer of titanium oxide must be removed. Removing the titanium oxide layer requires extra steps which increase the complexity and risk of unreliability of the entire IC fabrication process, thereby increasing the risk of diminished yields of suitably functioning ICs.

The central aspect of the present invention is applying a polymer barrier material to buffer and isolate the surface of the IC structure which contains the chemically-basic material above which the acid-catalyzed photoresist material will be deposited. A barrier is created between the chemically-basic contaminant-containing substance, and the barrier will mechanically and/or chemically stop or inhibit the contaminant from defusing into the photoresist material. Stopping or inhibiting the diffusion of the contaminant stops or inhibits the neutralization of the acid moieties of the photoresist material, allows the acid moieties to catalyze as intended, and generally results in greater precision and resolution in the patterns of developed photoresist and the structures created by the developed patterns of photoresist.

Preferably, the barrier material is a polymer which contains acid moieties. The polymer barrier material is applied in a thin film on the surface of the underlying IC structure which emits the chemically-basic contaminants. The photoresist material is thereafter coated on top of the thin film of the barrier material. The chemically-basic contaminants emitted from the underlying structure are physically and chemically blocked and inhibited by the barrier material. The contaminants that pass into the barrier layer interact with the acid moieties of the barrier material where the contaminants are neutralized. The photoresist material on top of the barrier material remains unaffected, so that exposure to light and heat during development causes the acid moieties to catalyze and destroy the polymer chains as intended to obtain greater precision and resolution in the developed photoresist material. More precise and resolved IC structures are created by using the more precise and resolved developed photoresist material. The effectiveness of the photoresist material becomes independent of the chemical nature of the IC structure upon which that photoresist material is deposited for patterning and development.

The features of the present invention are realized from a method of inhibiting neutralization of acid-catalyzed photoresist from chemically-basic contaminants emitted from a surface of an IC structure above which the photoresist is applied during the fabrication of the IC. The method includes applying a layer of barrier material on the surface of the IC structure from which the chemically-basic contaminants are emitted, applying a layer of the photoresist material on top of the layer of barrier material, and selecting the barrier material to have characteristics to inhibit the interaction of the contaminants with the photoresist. Preferably, the contaminants are inhibited from reaching the photoresist because the barrier layer physically inhibits the movement of the contaminants into contact with the photoresist, or the barrier material contains acid moieties which chemically neutralize the chemically-basic contaminants before they contact the photoresist. In addition, the barrier layer material preferably reacts with the developer which develops the photoresist at approximately the same rate that the developer reacts with the exposed photoresist, to remove the barrier layer from open areas of the developed photoresist at the same time that the photoresist is removed. Further still, the barrier materials are preferably selected to have characteristics which are substantially insoluble in the solvents which are typically present in the photoresist.

Another aspect of the invention relates to a method of increasing spatial resolution available from acid-catalyzed photoresist used in an IC fabrication process by physically inhibiting chemically-basic contaminants from contacting the photoresist placed above a surface of an IC structure which contains those chemically-basic contaminants. Again, the inhibition preferably occurs by chemically neutralizing the contaminants and/or physically inhibiting their movement into contact with the photoresist.

A more complete appreciation of the present invention and its scope may be obtained from the accompanying drawings, which are briefly summarized below, from the following detailed description of a presently preferred embodiment of the invention, and from the appended claims.

BRIEF DESCRIPTION OF THE DRAWINGS

FIG. 1 is a generalized cross-sectional view of a portion of an IC having multiple interconnect layers connected by vias and constructed on a substrate, to which the present invention may be advantageously applied during fabrication of the IC.

FIG. 2 is an enlarged cross-sectional view of an metal sheet structure from which electrical conductors of interconnect layers of the IC shown in FIG. 1 are formed, taken substantially in the plane of line 2—2 of FIG. 1.

FIG. 3 is a view similar FIG. 2, illustrating the prior art method of applying and exposing photoresist material on the metal sheet structure shown in FIG. 2.

FIG. 4 is a view illustrating the photoresist material shown in FIG. 3 after development, and also showing a problematic foot-like artifact created by the prior art, the discovery of which is an aspect of the present invention.

FIG. 5 is a view similar FIG. 2, illustrating the application of the present invention during the formation of an IC structure of the IC shown in FIG. 1.

FIG. 6 is a view similar to FIG. 4, illustrating the result of applying of the present invention as shown in FIG. 5.

DETAILED DESCRIPTION

Although the present invention has applicability to any type of semiconductor structure or integrated circuit (IC) and semiconductor and IC fabrication process in which a chemically-basic substance is present in or emitted from a layer or other component of that IC structure upon which acid-catalyzed photoresist material is deposited, one application of specific utility for the present invention is in patterning metal lines or conductors formed in a multi-interconnect layer IC 10 such as that shown in FIG. 1.

Each interconnect layer 12 of the IC 10 is formed by multiple, individually-defined electrical lines or conductors 14. The conductors 14 of each interconnect layer 12 extend between and connect to the other functional components (not shown) of the IC 10. Each interconnect layer 12 is separated by a relatively thick layer 16 of dielectric material 18. The dielectric material 18 of each layer 16 electrically insulates the interconnect layers 12 from one another and electrically insulates the other components within the IC 10 from one another. The individual conductors 14 of each interconnect layer 12 are also separated from one another by dielectric material. Vias 20 extend between the conductors 14 of the interconnect layers 12 to establish an electrical connection between the conductors 14 of the separate interconnect layers. It is also typical to include other electrical components such as capacitors (not shown) between the interconnect layers 12 in each layer 16 of dielectric material 18.

The multiple interconnect layers 12 and the dielectric layers 16 are built or layered above a substrate 22 of the IC. The substrate 22 serves as the foundation for the IC 10. Functional components, such as transistors 24 and capacitors (not shown) are formed in and on the substrate 22. The vias 20 also extend from the conductors 14 of the interconnect layers 12 into contact with conductive regions and elements of the functional components formed on the substrate 12. The ability to fabricate ICs 10 with multiple interconnect layers 12 has been made possible by planarization processes, for example chemical mechanical polishing (CMP).

To form each electrical conductor 14, an entire single metal sheet structure 26 (FIG. 2) is formed upon the top of a planarized layer 16 of dielectric material 18. Thereafter, the single metal sheet structure 26 is patterned using photoresist material, photolithographically exposed and etched, to form each of the individual electrical conductors 14 extending in the desired pattern of each interconnect layer 12. Each individual electrical conductor 14 therefore exhibits the same characteristics as the single metal sheet structure 26 (FIG. 2) from which it was formed.

The details of the metal sheet structure 26 from which the individual electrical conductors 14 are formed, are shown in FIG. 2, which is taken substantially in the plane of line 2—2 of FIG. 1. The metal sheet structure 26 is exemplary of an IC structure which emits chemically-basic contaminants into the photoresist material, to which the present invention applies. The sheet metal structure 26 is preferably formed of separate layers of metal. A layer 28 of aluminum forms the underlying base for the structure 26. The aluminum layer 28 is then placed in a vacuum chamber and vacuum sputtered with a thin layer 30 of titanium metal. The titanium metal layer 30 is typically approximately 20–50 angstroms thick. The metal structure 26 is then transferred under vacuum into a second sputter reaction chamber where titanium and ammonia are present. The titanium reacts with the ammonia in a sputter reaction to deposit a layer 32 of titanium nitride on top of the titanium layer 30. The titanium nitride layer 32 typically has a thickness of 50–500 angstroms. The titanium nitride layer 32 formed by the sputtering is somewhat porous. Because the sputter reaction which forms the titanium nitrate layer 32 occurs in an environment which contains a large amount of ammonia, the pores in the layer 32 trap and entrain ammonia.

After the sheet metal structure 26 shown in FIG. 2 has been formed in the manner described, it next subjected to photolithographic patterning in order to form the individual conductors 14 of the interconnect layers 12 (FIG. 1). The IC structure including the metal structure 26 is heated at approximately 120 to 180 degrees Centigrade, typically for a few to 90 seconds. The heating removes any fizzy-sorbed or chemy-sorbed water from the surface. The upper surface of the titanium nitride layer 32 is then treated with an adhesion promotion vapor or liquid deposited on the surface of the layer 32. The adhesion promotion substance creates an upper surface on the layer 32 that is adherent to the subsequent coating of photoresist material 34.

The photoresist material 34 is applied in a layer 36 by spin coating techniques to obtain a thin, uniform distribution over the upper surface of the titanium nitride layer 32, preferably by spin coating. Depending upon the type of photoresist material 34 applied, it may thereafter be heated at a low temperature in a "soft bake" procedure. Whether the resist material is soft baked or not depends on the characteristics of photoresist material. The photoresist layer 36 on top of the metal structure 26 is then photolithographically exposed. Light, typically ultraviolet light shown by arrows 38, is projected through a mask 40 having an opening 42. The light 38 which passes through the opening 42 and exposes the photoresist material 34 below the opening 42 in an area 44 which corresponds to the size and shape of the opening 42 in the mask 40. The other areas of the photoresist layer 36 which are blocked by the mask 40 are not exposed. The wavelength of the light 36 is selected to achieve the maximum responsiveness of the photoresist material 34, thereby achieving the maximum release of acid moieties from the light exposure.

Next, the semiconductor structure 10, metal layer 26 and layer 36 of photoresist material 34 are heated. The acid moieties that were generated from the exposure to the light are activated and begin attacking adjacent polymer molecules, thereby destroying those adjacent polymer molecules and releasing further acid moieties from those broken polymer chains in a catalytic response. The temperature which activates this catalytic response is on the order of 80 to 100 degrees Centigrade. The solubility of the photoresist material 34 in the area 44 is destroyed by the destruction of the long polymeric chains within the photoresist material 34. If there are any secondary chemistries applicable to the photoresist material 34 that can cause cross linking and toughening of the intact polymer chains in the unexposed areas of the layer 36, the heating promotes that cross linking and toughening.

Thereafter, the layer 36 of acid moiety catalyzed photoresist material 34 is developed. The photoresist material in the area 44 that was catalyzed by the acid moieties is now soluble, because the acid moieties have broken down the previously intact and insoluble polymer chains of the photoresist material. The developer solution is washed over the photoresist material 34 to remove the soluabilized photoresist material 34 from the area 44, thereby leaving an opening 46 behind, as shown in FIG. 4. The metal structure 26 and the developed layer 36 of photoresist material are then rinsed in deionized water, dried and heated to a temperature of from 100–150 degrees Centigrade to totally remove the moisture.

At this point, the metal structure 26 is ready to be etched by etchant applied to the metal structure through the opening 46 while the metal structures underneath the intact photoresist material 34 of the layer 36 are protected from the etchant by the remaining intact photoresist.

This invention is founded on the discovery that the ammonia content of the titanium nitride layer 32 interacts with the layer 36 of photoresist material 40 in an adverse manner. The chemically-basic ammonia neutralizes the acid moieties generated in the area 44 (FIG. 3) when the photoresist material 34 is exposed by the light 38 (FIG. 3). The neutralization of the acid moieties occurs primarily at the interface between the photoresist layer 36 and the upper surface of the titanium nitride 32. Usually the photoresist layer 36 is considerably thicker than the degree to which the ammonia from the titanium nitride layer 32 penetrates into the photoresist layer, so the primary adverse influence of the ammonia is at the photoresist layer-titanium nitride layer interface.

The effect of this neutralization is that the quantity of acid moieties at the interface is substantially reduced, which in turn creates a substantially reduced catalytic effect. The reduced catalytic effect diminishes the ability of the acid moieties to destroy the polymer chains of the photoresist material and therefore inhibits soluabilization of that photoresist material. The result is that small ragged edges or feet 48 of undeveloped and insoluabilized photoresist material project from the walls of the opening 46 at the interface with the titanium nitride layer 32. The feet 48 inhibit the etching and therefore create a ragged edge on the remaining portions of the intact photoresist material. Corresponding ragged edges are formed the on the edges of the electrical conductors 14 (FIG. 1) by etching the metal structure 26 into those conductors using the ragged-edge layer of photoresist. These ragged edges diminish the resolution between adjoining conductors 14 of the interconnect layers 12 (FIG. 1). The amount of neutralization of the acid moieties by the diffusing ammonia may cause the resulting ragged edges beneath the feet 48 to extend between adjoining electrical conductors 14 (FIG. 1) and electrically short out those electrical conductors to destroy the functionality of the IC 10 (FIG. 1).

The amount of ammonia emitted from the silicon nitride layer 32 is relatively small, although still sufficient to cause problems of resolution in fabricating ICs. It is possible to stop or inhibit the emission of the ammonia by putting a barrier layer 50 of material 52 between the silicon nitride layer 32 and the layer 36 of photoresist material, as shown in FIG. 5. The barrier layer 50 improves the acid catalytic response of the photoresist material. Since the light exposure and development steps for the photoresist material occur fairly rapidly, and the adverse influence of the ammonia may be reduced by the physical barrier characteristics of the layer 50 which retards the diffusion of the ammonia into the photoresist layer. The barrier layer 50 may also, in addition to its physical barrier characteristics, include acid moieties which neutralize the ammonia before the ammonia reaches the photoresist layer.

A number of polymeric materials can be used to form the barrier layer 50, for example polyimides. Preferably the type of polymeric material should not inhibit the catalyzation of the acid moieties in the photoresist material. At room temperature a purely mechanical-barrier polymer material may have the desired effect of mechanically slowing the defusion of ammonia. However, for the acid moieties to catalyze the polymers of the photoresist material, it is necessary to raise the temperature to approximately 80–100 degrees Centigrade for the autocatalytic chemistry to take place, as discussed above. The elevation in temperature takes many mechanical-barrier polymer materials above their glass transition temperature, in which case the materials have a reduced capacity to slow the diffusion of the ammonia into the photoresist layer.

Even though mechanically stopping or inhibiting the diffusion of the ammonia into the photoresist material by physical-barrier characteristics is a significant improvement, completely eliminating the penetration of the ammonia into the photoresist material to stop the adverse influence of the ammonia is even better. Accordingly, another aspect of the invention is to select the material 52 for the barrier layer 50 to contain acid moieties which will neutralize the ammonia as it diffuses through the barrier layer 50. A barrier material 52 which neutralizes the ammonia is advantageous to augment or replace the physical barrier properties of the material in the barrier layer 50. The physical barrier effect from the layer 50 will slow down the migration of the ammonia into the photoresist material, but the acid moiety content of the barrier material 52 will neutralize the ammonia. Suitable barrier materials 52 which contain acid moieties to neutralize the ammonia diffusing from the titanium nitride layer are sulfonate ester of acrylic polymers or aromatic polymer.

The material 52 of the barrier layer 50 should contain enough acid moieties to neutralize the ammonia during the time required for the application of the barrier layer 50 on the titanium nitride layer 32 until the time that the barrier layer 50 is removed after exposure of the photoresist material. There is a finite amount of acid material that can be added into many polymeric materials, so only a limited amount of time is available for the barrier material 52 to inhibit the diffusion of ammonia, both because of its mechanical properties and because of its chemical properties. A greater thickness of the barrier material provides greater mechanical and chemical effects against the diffusing ammonia before the ammonia penetrates through to the barrier layer 50 and into photoresist layer 36. In general, an acceptably thick layer of the barrier material 52 is a few hundred angstroms.

The steps of practicing the methodology of the present invention are described by reference to the semiconductor structure shown in FIG. 5. Prior to forming the barrier layer 50, the metal structure 26 is formed in the same way as has been described in conjunction with FIG. 2. The barrier material 52, which is preferably a acid moiety-containing polymer material, is coated and spun as the layer 50 onto the upper surface of the titanium nitride layer 32. The upper surface of the titanium nitride layer 32 may be subject to an adhesion promotion surface treatment of the nature previously described in conjunction with FIG. 3, to promote the adhesion of the layer 50 of barrier material, although certain acid containing polymers do not require adhesion promotion treatment of the same sort as is required for the application of the photoresist material.

The barrier layer 50 is thereafter coated with the layer 36 of photoresist material 34, in the conventional manner, such as by spinning on the photoresist material in the uniform layer 36. The acid moiety-containing barrier material 52 is chosen to be insoluble in the solvents of the normal photoresist material or at least only weakly soluble. The photoresist material is then soft baked, if necessary, exposed, and is heated again to promote the catalytic action of the acid moieties, all in the conventional manner described above. It is with this heating step that the advantage of the underlying acid moiety-containing polymeric barrier material 52 has its greatest effect in inhibiting the diffusion of the ammonia from the underlying titanium nitride layer 32 into the photoresist layer 36.

The photoresist layer 36 is thereafter sprayed with the developer, and the exposed areas 44 of the photoresist layer 36 are washed away as shown in FIG. 6, all in the conventional manner described above. The acid moiety-containing polymeric barrier material is also selected to react approximately at the same rate to the developer as does the photoresist. Since the barrier material is acid moiety containing polymer, the developer causes the barrier material 52 at the exposed area 44 (FIG. 5) to dissolve, and any residual layer of the barrier material 50 would inhibit the subsequent etching steps. If the solubility of the barrier layer material 52 in the developer is too great, the removal of the unexposed intact areas of photoresist material would be promoted, thereby causing an undesirable effect. If the solubility of the barrier material 52 is too low, an extended time of interaction with the developer is required to remove it, and that extended time of interaction will adversely influence the profile of the intact photoresist. Suitable acid moietycontaining polymeric barrier materials polymers can be adjusted in the amount of acid contained and additional materials contained so as to control its dissolution rate in the developer. A lesser-desired alternative to dissolving the layer 50 of barrier material 52 by the developer is removing it by physical processes, plasma etching or sputtering.

By using the barrier layer 50 of acid moiety-containing polymeric barrier material, the edges of the developed photoresist are more precise and resolved. As is shown in FIG. 6, the edges of the hole 46 do not contain the feet 48 which are typically formed as shown in FIG. 4. As a consequence the edges of the conductors 14 of the interconnector layers 12 (FIG. 1) are more resolved at the locations where they are intended and the risk of inadvertent electrical short circuits between adjoining electrical conductors formed by incomplete etching the metal sheet structures into the individual electrical conductors is greatly diminished. The intended effectiveness of the photoresist material is maintained, by avoiding the adverse influences of the chemically-basic contaminants diffused from the underlying layers of the semiconductor structure during formation of the IC. Even under circumstances where the barrier layer 50 does not contain acid moiety-containing polymers, the mechanical barrier from the barrier layer 50 substantially enhances the quality of the patterns created by modern photoresist materials. Many other advantages and improvements will be apparent upon gaining a full understanding and appreciation of the present invention.

A presently preferred embodiment of the present invention and many of its improvements have been described with a degree of particularity. This description is a preferred example of implementing the invention, and is not necessarily intended to limit the scope of the invention. The scope of the invention is defined by the following claims.

The invention claimed is:

1. A method of inhibiting neutralization of acid-catalyzed photoresist from chemically-basic contaminants emitted from a surface of an integrated circuit (IC) structure above which the photoresist is applied during the fabrication of the IC, comprising the steps of:

applying a layer of barrier material on the surface of the IC structure from which the chemically-basic contaminants are emitted, wherein the IC structure which emits the contaminants includes tungsten nitride;

applying a layer of the photoresist material on top of the layer of barrier material; and selecting the barrier material to have characteristics to inhibit the interaction of the contaminants with the photoresist.

2. A method as defined in claim 1 further comprising the step of:

selecting the barrier material to have characteristics which inhibit physical movement of the contaminants into contact with the photoresist.

3. A method as defined in claim 1 further comprising the step of:

selecting the barrier material to have characteristics which prevent physical contact of the contaminants with the photoresist.

4. A method as defined in claim 1 further comprising the step of:

selecting the barrier material to contain acid moieties.

5. A method as defined in claim 4 further comprising the step of:

selecting the barrier material with sufficient acid moieties to neutralize the chemically-basic contaminants before the chemically-basic contaminants influence the photoresist.

6. A method as defined in claim 5 further comprising the step of:

selecting the barrier material to contain a sufficient amount of acid moieties to neutralize substantially all of the contaminants passing through the barrier layer.

7. A method as defined in claim 5 further comprising the step of:

selecting the barrier material to contain a sufficient amount of acid moieties to neutralize substantially all of the contaminants before the contaminants move into contact with the photoresist.

8. A method as defined in claim 1 further comprising the steps of:

selecting the barrier material to have characteristics which inhibit physical movement of the contaminants into contact with the photoresist; and selecting the barrier material to contain acid moieties to neutralize the chemically-basic contaminants entering the barrier layer from the IC structure.

9. A method as defined in claim 8 further comprising the step of:

selecting the barrier material with a sufficient quantity of the acid moieties to neutralize substantially all of the chemically-basic contaminants before the contaminants can move from the barrier layer into the photoresist.

10. A method as defined in claim 8 further comprising the step of:

applying a layer of the barrier material of sufficient thickness to contain a sufficient quantity of the acid moieties to neutralize substantially all of the chemically-basic contaminants before the contaminants can move from the barrier layer into the photoresist.

11. A method as defined in claim 1 wherein the photoresist reacts with a developer and the method further comprises the step of:

selecting the barrier material to react with the developer at approximately the same rate that the developer reacts with the photoresist.

12. A method as defined in claim 1 wherein areas of photoresist are removed by interaction with a developer after the photoresist has been exposed and the method further comprises the step of:

removing the barrier material below the areas of removed photoresist material.

13. A method as defined in claim 12 further comprising the step of:

removing the barrier material below the areas of removed photoresist approximately simultaneously with removing the areas of photoresist.

14. A method as defined in claim 13 wherein the areas of photoresist are removed by contact with the developer and the method further comprises the step of:

removing the barrier material below the areas of removed photoresist by contact with the developer.

15. A method as defined in claim 12 further comprising the step of:

physically removing the barrier material below the areas of photoresist after the photoresist has been removed from those areas.

16. A method as defined in claim 1 wherein the photoresist contain solvents and the method further comprises the step of:

selecting the barrier material to have characteristics which are substantially insoluble to the solvents of the photoresist.

17. A method as defined in claim 1 wherein the chemically-basic contaminant is ammonia.

18. A method as defined in claim 1 wherein the IC structure which emits the contaminants is a metal structure of an interconnect layer formed in the IC.

19. A method as defined in claim 1 wherein the IC structure which emits the contaminants includes titanium nitride.

20. A method as defined in claim 1 wherein the IC structure which emits the contaminants includes a metal nitride formed by sputtering metal in an environment of ammonia.

21. A method of increasing spatial resolution available from acid-catalyzed photoresist used in an integrated circuit (IC) fabrication process by inhibiting chemically-basic contaminants from contacting the photoresist layered above an IC structure which emits those chemically-basic contaminants, wherein the IC structure which emits the contaminants includes tungsten nitride.

22. A method as defined in claim 21 further comprising the step of chemically neutralizing the contaminants at a surface of the photoresist before the contaminants enter the photoresist.

23. A method as defined in claim 21 further comprising the step of physically restricting movement of the contaminants into contact with the photoresist.

* * * * *